(12) United States Patent
Silveira et al.

(10) Patent No.: US 9,214,315 B2
(45) Date of Patent: Dec. 15, 2015

(54) TEMPERATURE CONTROL IN PLASMA PROCESSING APPARATUS USING PULSED HEAT TRANSFER FLUID FLOW

(71) Applicant: Applied Materials, Inc., Santa Clara, CA (US)

(72) Inventors: Fernando M. Silveira, Livermore, CA (US); Hamid Tavassoli, Cupertino, CA (US); Xiaoping Zhou, San Jose, CA (US); Shane C. Nevil, Livermore, CA (US); Douglas A. Buchberger, Livermore, CA (US); Brad L. Mays, Findlay, OH (US); Tina Tsong, San Jose, CA (US); Chetan Mahadeswaraswamy, Sunnyvale, CA (US); Yashaswini B. Pattar, Palo Alto, CA (US); Duy D. Nguyen, Milpitas, CA (US); Walter R. Merry, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/580,184

(22) Filed: Dec. 22, 2014

(65) Prior Publication Data

US 2015/0316941 A1    Nov. 5, 2015

Related U.S. Application Data

(62) Division of application No. 13/111,334, filed on May 19, 2011, now Pat. No. 8,916,793.

(60) Provisional application No. 61/362,232, filed on Jul. 7, 2010, provisional application No. 61/352,779, filed on Jun. 8, 2010.

(51) Int. Cl.
*B23K 10/00* (2006.01)
*H01J 37/20* (2006.01)
*H05H 1/34* (2006.01)

(52) U.S. Cl.
CPC . *H01J 37/20* (2013.01); *H05H 1/34* (2013.01)

(58) Field of Classification Search
CPC ...... C23C 16/46; C23C 16/455; C23C 16/40; B23K 10/00; H05J 37/20; H05H 1/28; H05H 1/48; H05H 1/46; H05R 43/16
USPC ............. 219/121.41, 121.43, 121.52, 121.49, 219/121.4; 118/723 R, 724, 725; 156/345.34, 345.47, 345.52, 345.53
See application file for complete search history.

(56) References Cited

U.S. PATENT DOCUMENTS 5,435,145 A    7/1995    Jaster
5,548,470 A    8/1996    Husain et al.
(Continued)

FOREIGN PATENT DOCUMENTS

CN    1956143 (A)     5/2007
CN    101320675 A    12/2008
(Continued)

OTHER PUBLICATIONS

Doug J. Cooper, "Integral Action and Pi Control", Controlguru Practical Process Control E-Textbook., 5 pages.
(Continued)

*Primary Examiner* — Mark Paschall
(74) *Attorney, Agent, or Firm* — Blakely Sokoloff Taylor & Zafman LLP (57) ABSTRACT

Methods and systems for controlling temperatures in plasma processing chamber via pulsed application of heating power and pulsed application of cooling power. In an embodiment, temperature control is based at least in part on a feedforward control signal derived from a plasma power input into the processing chamber. In further embodiments, fluid levels in each of a hot and cold reservoir coupled to the temperature controlled component are maintained in part by a passive leveling pipe coupling the two reservoirs. In another embodiment, digital heat transfer fluid flow control valves are opened with pulse widths dependent on a heating/cooling duty cycle value and a proportioning cycle having a duration that has been found to provide good temperature control performance.

7 Claims, 9 Drawing Sheets

(56) References Cited

U.S. PATENT DOCUMENTS

| | | |
|---|---|---|
| 5,644,467 A | 7/1997 | Steger et al. |
| 6,026,986 A | 2/2000 | Choi et al. |
| 6,125,025 A | 9/2000 | Howald et al. |
| 6,142,208 A | 11/2000 | Eberhardt et al. |
| 6,221,205 B1 | 4/2001 | Blalock et al. |
| 6,606,234 B1 | 8/2003 | Divakar |
| 6,635,117 B1 | 10/2003 | Kinnard et al. |
| 6,782,843 B2 | 8/2004 | Kinnard et al. |
| 6,891,124 B2 | 5/2005 | Denton et al. |
| 6,921,724 B2 | 7/2005 | Kamp et al. |
| 7,069,984 B2 | 7/2006 | Jeong |
| 7,221,553 B2 | 5/2007 | Nguyen et al. |
| 8,226,769 B2 | 7/2012 | Matyushkin et al. |
| 8,608,852 B2 | 12/2013 | Mahadeswaraswamy et al. |
| 2002/0162175 A1 | 11/2002 | Berglund |
| 2003/0205328 A1 | 11/2003 | Kinnard et al. |
| 2006/0027324 A1 | 2/2006 | Makino et al. |
| 2006/0076109 A1 | 4/2006 | Holland et al. |
| 2006/0196451 A1 | 9/2006 | Braun et al. |
| 2006/0269691 A1 | 11/2006 | Saki |
| 2006/0283549 A1 | 12/2006 | Aramaki et al. |
| 2007/0032087 A1 | 2/2007 | Nishino et al. |
| 2007/0080136 A1 | 4/2007 | Takata et al. |
| 2007/0091537 A1 | 4/2007 | Buchberger, Jr. et al. |
| 2007/0091538 A1 | 4/2007 | Buchberger, Jr. et al. |
| 2007/0258186 A1 | 11/2007 | Matyushkin et al. |
| 2008/0023139 A1 | 1/2008 | Yasui et al. |
| 2008/0035306 A1 | 2/2008 | White et al. |
| 2008/0060978 A1 | 3/2008 | Wegner |
| 2008/0224273 A1 | 9/2008 | America et al. |
| 2008/0271471 A1 | 11/2008 | Nozawa et al. |
| 2008/0311756 A1 | 12/2008 | Chen et al. |
| 2009/0044752 A1 | 2/2009 | Furuya |
| 2009/0065181 A1 | 3/2009 | Mockry et al. |
| 2009/0095218 A1 | 4/2009 | Meinhold et al. |
| 2009/0155437 A1 | 6/2009 | Bohnert et al. |
| 2009/0183677 A1 | 7/2009 | Tian et al. |
| 2009/0229638 A1 | 9/2009 | Yun et al. |
| 2009/0294101 A1 | 12/2009 | Fovell et al. |
| 2009/0310645 A1 | 12/2009 | Kofuji et al. |
| 2010/0083952 A1 | 4/2010 | van Houten |
| 2010/0116788 A1 | 5/2010 | Singh et al. |
| 2010/0210041 A1 | 8/2010 | Chang et al. |
| 2011/0186545 A1 | 8/2011 | Mahadeswaraswamy et al. |
| 2012/0048467 A1 | 3/2012 | Mahadeswaraswamy et al. |
| 2012/0132397 A1 | 5/2012 | Silveira et al. |
| 2013/0023122 A1 | 1/2013 | Nemani et al. |
| 2013/0023123 A1 | 1/2013 | Zhou et al. |
| 2013/0023124 A1 | 1/2013 | Nemani et al. |
| 2013/0109187 A1 | 5/2013 | Nemani et al. |
| 2013/0109188 A1 | 5/2013 | Kim et al. |
| 2013/0224962 A1 | 8/2013 | Koelmel et al. |
| 2013/0279066 A1 | 10/2013 | Lubomirsky et al. |

FOREIGN PATENT DOCUMENTS

| | | |
|---|---|---|
| CN | 101583234 A | 11/2009 |
| EP | 0 766 300 A1 | 4/1997 |
| EP | 1770753 | 4/2007 |
| JP | H07-96170 | 4/1995 |
| JP | H08-55905 A | 2/1996 |
| JP | H0855905 A | 2/1996 |
| JP | H09129717 (A) | 5/1997 |
| JP | P2001-60585 A | 3/2001 |
| JP | 2002-009049 | 1/2002 |
| JP | 2002-009049 A | 1/2002 |
| JP | 2002-071234 (A) | 3/2002 |
| JP | 2002-526923 (A) | 8/2002 |
| JP | 2004-63670 | 2/2004 |
| JP | 2004-069933 | 3/2004 |
| JP | 2004-508728 (A) | 3/2004 |
| JP | 2004-169933 A | 6/2004 |
| JP | 2005-79415 | 3/2005 |
| JP | 2005-150173 | 6/2005 |
| JP | 2005-150173 A | 6/2005 |
| JP | 2005-175460 | 6/2005 |
| JP | 2005-175460 A | 6/2005 |
| JP | 2006-049497 (A) | 2/2006 |
| JP | 2007-501907 A | 4/2006 |
| JP | 2006-351887 A | 12/2006 |
| JP | 2007-88394 | 4/2007 |
| JP | 2007-157696 (A) | 6/2007 |
| JP | 2001-237226 | 12/2007 |
| JP | 2007-316039 | 12/2007 |
| JP | 2008-177428 | 7/2008 |
| JP | 2008-177428 A | 7/2008 |
| JP | 2008-305856 A | 12/2008 |
| JP | 3147392 | 12/2008 |
| JP | 2010-050463 (A) | 3/2010 |
| JP | 2010-050464 (A) | 3/2010 |
| JP | 2010-062570 (A) | 3/2010 |
| JP | 2010-097854 A | 4/2010 |
| KR | 10-2008-0107261 | 12/2008 |
| KR | 10-2009-0118839 | 11/2009 |
| TW | I358765 | 10/1995 |
| TW | 200816362 | 8/1996 |
| TW | 200912989 | 6/1997 |
| TW | I314842 | 1/2006 |
| TW | 200727325 A | 7/2007 |
| TW | 200952068 A1 | 12/2009 |
| WO | WO 00/19519 | 4/2000 |
| WO | WO 02/21590 A2 | 3/2002 |
| WO | WO 2010/055441 A2 | 5/2010 |

OTHER PUBLICATIONS

International Search Report and Written Opinion for corresponding International Application No. PCT/US2010/062435, mailing date Aug. 22, 2011, 9 pages.

International Search Report and Written Opinion for corresponding International Application No. PCT/US2011/037436, mailing date Nov. 28, 2011, 8 pages.

International Search Report and Written Opinion for corresponding International Application No. PCT/US2011/039182, mailing date Nov. 28, 2011, 9 pages.

International Preliminary Report on Patentability for corresponding International Application No. PCT/US2010/062435, dated Jul. 31, 2012, 5 pages.

International Search Report and Written Opinion for corresponding International Application No. PCT/US2012/059573, dated Jan. 2, 2013, 9 pages.

International Preliminary Report for corresponding International Application No. PCT/US2012/059573, dated Apr. 29, 2014, 5 pages.

Howard, Brad, "Applied Centura® Avatar™ Etch Enabling New Dimensions in High Aspect Ratio Etching", Silicon Systems Group, Jun. 27, 2012, 20 pages.

PCT International Preliminary Report on Patentability and Written Opinion for corresponding International Application No. PCT/US2012/059573 (P1033PCT), mailed May 8, 2014, 6pgs.

PCT International Preliminary Report on Patentability and Written Opinion for corresponding International Application No. PCT/US2011/037436 (P980PCT), mailed Nov. 27, 2012, 4 pages.

TEMPERATURE CONTROL IN PLASMA PROCESSING APPARATUS USING PULSED HEAT TRANSFER FLUID FLOW

CROSS-REFERENCE TO RELATED APPLICATIONS

This is a Divisional Application of Ser. No. 13/111,334, filed on May 19, 2011, entitled "TEMPERATURE CONTROL IN PLASMA PROCESSING APPARATUS USING PULSED HEAT TRANSFER FLUID FLOW", which is presently pending and claims the benefit of U.S. Provisional Application No. 61/352,779 filed on Jun. 8, 2010, entitled "PULSED-COOLING CHILLER FOR PLASMA PROCESSING APPARATUS"; and U.S. Provisional Application No. 61/362,232 filed on Jul. 7, 2010, entitled "TEMPERATURE CONTROL IN PLASMA PROCESSING APPARATUS USING PULSED HEAT TRANSFER FLUID FLOW," the entire contents of which are hereby incorporated by reference in its entirety for all purposes.

This application is related to U.S. Provisional Application No. 61/299,818 filed on Jan. 29, 2010, entitled "FEEDFORWARD TEMPERATURE CONTROL FOR PLASMA PROCESSING APPARATUS"; and U.S. Utility application Ser. No. 12/905,624 filed on Oct. 15, 2010, entitled "FEEDFORWARD TEMPERATURE CONTROL FOR PLASMA PROCESSING APPARATUS."

BACKGROUND

1) Field

Embodiments of the present invention generally relate to plasma processing equipment, and more particularly to methods of controlling temperatures during processing of a workpiece with a plasma processing chamber.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to maintain the temperature of a chamber component at a desired temperature. A controller, such as a PID (proportional-integral-differential) controller is employed for feedback control of the heat transfer between the temperature controlled component and the heat sink/source. Steady state errors occur with simple feedback control unless a large enough integrator is used. In simple Proportional control there is always steady state error in the presence of external disturbance (unless proportional gain is infinity). However use of large integral control results in poor transients with large overshoots and requires and long settling times. Unlike mass flow controllers (MFCs) which have short response times requiring only a few seconds to converge to a setpoint, chamber component temperatures, such as an electrostatic chuck or showerhead temperature, may require 30 seconds or more to stabilize when perturbed during a plasma process due to the significant thermal mass of the chuck, etc. As such, to most quickly compensate for disturbances, large integrator values may be utilized in the feedback controller which has the undesirable side effect of making the temperature control more unstable.

Furthermore, to accommodate increasingly complex film stacks, many plasma processes expose a workpiece to a number of sequential plasma conditions within a same processing chamber. Operations in such in-situ recipes (performed within a single manufacturing apparatus rather than in separately tuned systems) may require temperature setpoints spanning a wide range.

A temperature control architecture for a plasma processing chamber that improves stability and provides for improved transient response and small steady state error when perturbed is therefore desirable.

SUMMARY

Methods and systems for controlling temperatures in plasma processing chamber via pulsed application of heating power and pulsed application of cooling power are described. In an embodiment, temperature control is based at least in part on a feedforward control signal derived from a plasma power input into the processing chamber. In further embodiments, fluid levels in each of a hot and cold reservoir coupled to the temperature controlled component are maintained in part by a passive leveling pipe coupling the two reservoirs. In another embodiment, digital heat transfer fluid flow control valves are opened with pulse widths dependent on a heating/cooling duty cycle value and a proportioning cycle having a duration that has been found to provide good temperature control performance. In other embodiments, thicknesses of a ceramic puck in a temperature controlled chuck are reduced to less than 10 mm to provide a thermal time constant that is well-matched with the proportioning cycle duration to provide fast temperature control response times.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIG. 3D illustrates time proportioning in pulse width modulation employed to control a duty cycle of the valves

385, 386 of the plumbing schematic depicted in FIG. 3B, in accordance with an embodiment of the present invention;

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm or method is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a non-transitory storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions in a non-transitory manner, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Embodiments of methods and systems for controlling a process or chamber component temperature described herein provide a temperature control effort via a feedforward control line that produces a feedforward control signal that compensates a disturbance transfer function. More particularly, the feedforward control transfer function is preferably equal and opposite to the disturbance transfer function to neutralize the disturbance to the temperature being controlled. In further embodiments, the feedforward control signal is added to a feedback control effort such that the feedback loop is called upon to provide a lesser control effort and therefore allow for lower feedback gains for temperature error correction than required in the absence of the feedforward control signal. With the lower feedback gains, improved temperature stability and improved transient responses (e.g., reduced overshoot, reduced rise time, etc.) relative to conventional plasma processing systems are achieved.

Figure 1:
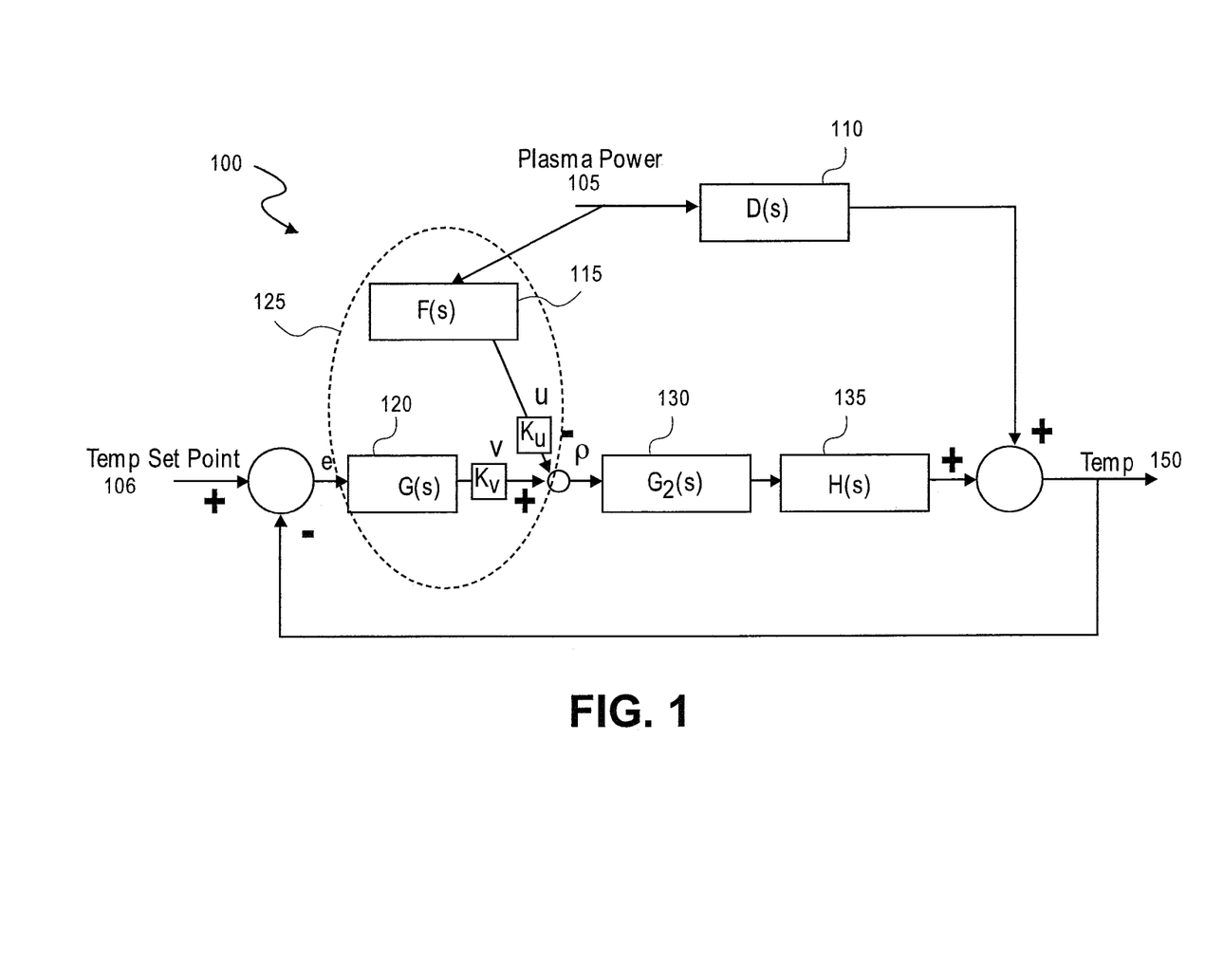
FIG. 1 is a block diagram illustrating a temperature control system including both feedforward and feedback control elements, in accordance with an embodiment of the present invention.

FIG. 1 is a block diagram illustrating a temperature control system 100 in the Laplace domain including both feedforward (e.g., F(s) 115) and feedback (e.g., G(s) 120) control elements, in accordance with an embodiment of the present invention. Because commercially available temperature controllers lack a feedforward input for disturbance compensation (e.g., providing only for a feedback control with inputs including a measured controlled temperature 150 and temperature setpoint 106), particular embodiments provide feedforward control by moving control computations for the feedback transfer function G(s) 120 off an autonomous temperature control plane (e.g., a discrete PID controller) and onto an integrated control software plane 125 of the plasma processing system which computes both the feedback and feedforward control efforts. As further described herein, the discrete temperature controller may then be utilized merely as a driver of the control actuators (e.g., valves, resistive elements, etc.) operating under the direction of the integrated plasma chamber control software plane 125 executing instructions implementing the temperature control system 100. In alternative embodiments however, a discrete temperature controller is configured to provide the feedforward control described herein with the associated control computations off-loaded from the integrated control software plane 125.

As shown in FIG. 1, the temperature control system 100 includes the feedforward transfer function F(s) 115 which takes, as an input, a plasma power 105 introduced into the plasma process chamber during processing of a workpiece. The plasma power 105 input into the feedforward line may be based on any power output by a plasma power source, such as an RF generator, magnetron, etc., that places an appreciable heat load on the temperature controlled system component. The feedforward transfer function F(s) 115 is to emulate the disturbance transfer function D(s) 110 and output a feedforward control signal u providing a control effort opposite in sign to the disturbance transfer function D(s) 110 and compensating an increase in the controlled temperature 150 resulting from the disturbance caused by the plasma source power heat load. The disturbance transfer function D(s) 110 relates a heat load of the plasma power 105 to a rise in the controlled temperature 150 of the plasma processing system having a particular thermal time constant, τ. For example, in the process recipe depicted in FIG. 2, a step function increase in a plasma power from 700 W to 1200 W between process recipe steps "1" and "2" may be mapped by the disturbance transfer function D(s) 110 to a system temperature rise over time which may be neutralized by an external cooling effort to maintain a temperature setpoint 106 (25° C. in FIG. 2).

In the embodiment depicted in FIG. 1, the feedforward control signal u is coupled with a feedback control loop in which the feedback transfer function G(s) 120 provides a feedback control signal v. The temperature control system 100 retains the feedback control signal v for correction of the error signal e corresponding to a difference between the controlled temperature 150 and the temperature setpoint 106. The feedforward control signal u, along with the temperature setpoint 106, is input to an actuator transfer function $G_2(s)$ 130 and a thermal mass transfer function H(s) 135 to compensate the effect of the disturbance transfer function D(s) 110 on the output controlled temperature 150. The actuator transfer function $G_2(s)$ 130 includes a function of an actuator controlling a heat transfer between the temperature controlled component and a heat sink and may further include a function of an actuator controlling a heat transfer between the temperature controlled component and a heat source. As shown in FIG. 1, the actuator of the feedback control is also utilized for the feedforward control such that the addition of the feedfoward transfer function F(s) 115 may be implemented with the same actuator as a conventional feedback control system which may already be fitted to a plasma processing chamber. The actuator may be implemented in any manner commonly employed in the art. For example, in one embodiment, the actuator includes one or more valves controlling a heat transfer fluid (s) flow rate coupled between the temperature controlled component and a heat sink and/or heat source. In an alternate embodiment, the actuator includes one or more resistive heating elements coupled to the temperature controlled component. The thermal mass transfer function H(s) 135 includes a function of the heat capacities of the heat sink/source and the temperature controlled component.

Therefore, for the exemplary embodiment depicted in FIG. 1, the feedforward transfer function F(s) 115 takes the form:

$$F(s) = \frac{D(s)}{G_2(s)H(s)}, \text{ with}$$

$$D(s) = \frac{K_{disturbance}}{s + \frac{1}{\tau}}, \text{ and}$$

$$H(s) = \frac{K_H}{s + \frac{1}{\tau}}.$$

Figure 2:
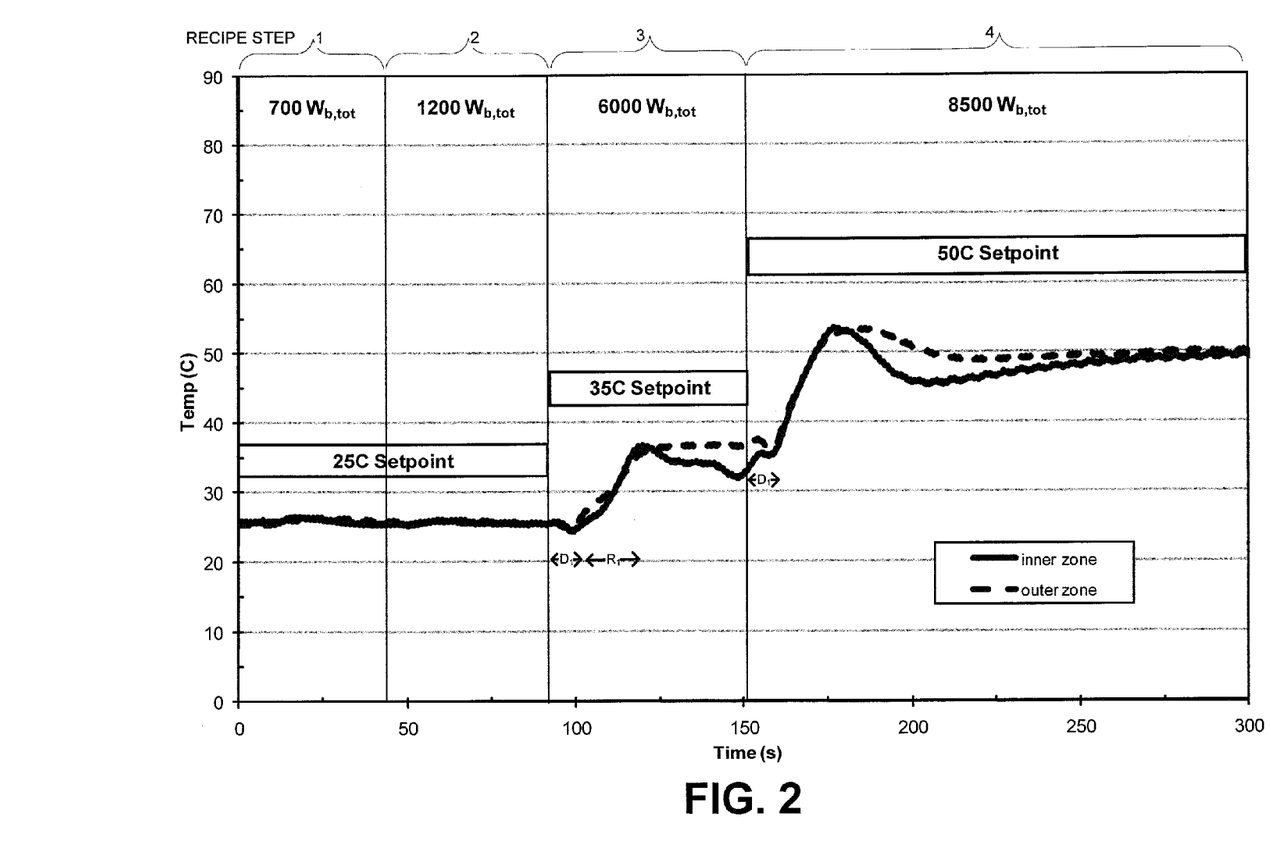
FIG. 2 illustrates a chuck temperature over a plurality of steps in a processing recipe in which both plasma power input into a processing system and a temperature setpoint is varied, in accordance with an embodiment of the present invention.

FIG. 2 illustrates a workpiece supporting chuck temperature over a plurality of sequential processing steps of a single processing recipe in which both plasma power input into a processing system and a temperature setpoint is varied, in accordance with an embodiment of the present invention. As shown, between steps 1 and 2, the plasma power input into the processing system increases from 700 W total bias power to 1200 W total bias power. With the control system of FIG. 1, a setpoint temperature of 25° C. is maintained in both an inner temperature zone and outer temperature zone of the chuck even with the step function in plasma power. As further illustrated in step 3 of the process recipe the setpoint temperature increases to 35° C. for the duration of the step (e.g., approximately 60 seconds) upon which the setpoint temperature increases to 50° C. for the balance of the process recipe. As such, FIG. 2 is illustrative of a wide setpoint temperature range (25° C.) within a single process recipe and also of a fast setpoint temperature ramp rate in which an intermediate temperature (35° C.) is employed for only a short duration. With the short duration of step 3, the plasma processing apparatus takes on an additional function of rapid thermal processing whereby a fast temperature response time is necessary to ensure the plasma processing physics are controlled in the manner expected (e.g., appropriate deposition rates, appropriate etch rates, etc.).

In the embodiment depicted in FIG. 2, the thermal time constant of the system is apparent from the delay $D_1$, which is approximately 10 seconds. As further illustrated, a temperature ramp rate of approximately 1° C./second is achieved over the time $R_1$. As one of skill in the art will appreciate, it is non-trivial to achieve such a short delay in a mechanical system having a physical size typical of a plasma processing system utilized in the semiconductor arts (e.g., 300 mm platform) and a discussion of the features enabling such good performance are now described in some detail.

Figure 3A:
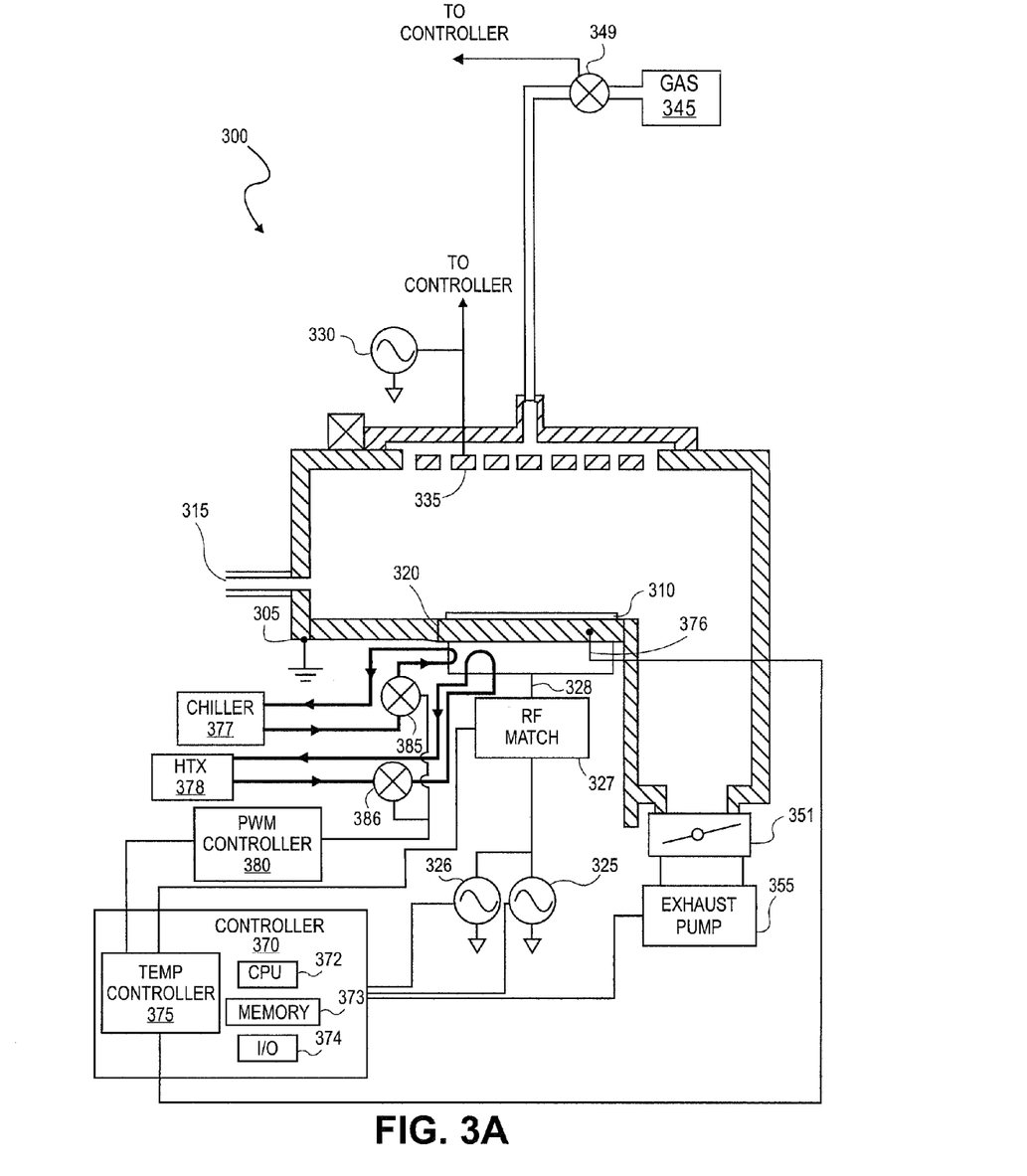
FIG. 3A illustrates a schematic of a plasma etch system including a heat transfer fluid-based heat source and a heat transfer fluid-based heat sink coupled to a workpiece supporting chuck, in accordance with an embodiment of the present invention.

FIG. 3A illustrates a cross-sectional schematic view of a plasma etch system 300 which includes a component for which temperature is controlled. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature controlled component.

The plasma etch system 300 includes a grounded chamber 305. A substrate 310 is loaded through an opening 315 and clamped to a temperature controlled electrostatic chuck 320. The substrate 310 may be any workpiece conventionally employed in the plasma processing art and the present invention is not limited in this respect. In particular embodiments, temperature controlled chuck 320 includes a plurality of zones, each zone independently controllable to a temperature setpoint 106 (FIG. 1) which may be the same or different between the zones. In the exemplary embodiment, an inner thermal zone 322 is proximate a center of substrate 310 and an outer thermal zone 321 is proximate to a periphery/edge of substrate 310. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A first plasma bias power 325 is coupled to the chuck 320 (e.g., cathode) to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325 to provide a dual frequency bias power. In one dual frequency bias power embodiment a 13.56 MHz generator supplies between 500 W and 3000 W while a 2 MHz generator supplies between 0 and 7000 W of power for a total bias power ($W_{b,tot}$) of between 500 W and 10000 W. In another dual frequency bias power embodiment a 60 MHz generator supplies between 100 W and 3000 W while a 2 MHz generator supplies between 0 and 7000 W of power for a total bias power ($W_{b,tot}$) of between 100 W and 10000 W.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, such as between 100 and 180 MHz, and in a particular embodiment, is in the 162 MHz band. In particular embodiments the top source operates between 100 W and 2000 W. Bias power more directly affects the bias voltage on substrate 310, controlling ion bombardment of the substrate 310, while source power more directly affects the plasma density. Notably, the system component to be temperature controlled by the control system 100 is neither limited to the chuck 320 nor must the temperature controlled component directly couple a plasma power into the process chamber. In an alternative embodiment for example, a showerhead through which a process gas is input into the plasma process chamber is controlled with the temperature control system 100. For such showerhead embodiments, the showerhead may or may not be RF powered.

For a high bias power density (kW/workpiece area) embodiment, such as that illustrated in FIG. 2 applicable to dielectric etching, it is problematic to supply heating power to the chuck 320 via a resistive heater because of RF filtering issues. For the system 300, the chuck heating power (e.g., to elevate the chuck temperature to 50° C. in step 4 of FIG. 2) is provided by a heat transfer fluid loop. For such embodiments, a first heat transfer fluid loop cools the chuck 320 and a second heat transfer fluid loop heats the chuck 320. In the exemplary embodiment, the temperature controller 375 is coupled, either directly, or indirectly (via the integrated control software plane 125) to a chiller 377 (heat sink) and a heat exchanger 378 (heat source). The temperature controller 375 may acquire the temperature setpoint of the chiller 377 or the heat exchanger (HTX) 378. A difference between the temperature of the chiller 377 and the temperature setpoint 106 and the difference between the temperature of the heat exchanger 378 and the temperature setpoint 106 is input into the feedfoward control line along with the plasma power (e.g., total bias power). The chiller 377 is to provide a cooling power to the chuck 320 via a coolant loop thermally coupling the chuck 320 with the chiller 377. In the exemplary embodiment therefore, two coolant loops are employed. One coolant loop has a cold liquid (e.g., Galden or Fluorinert, etc. at a temperature setpoint of −5° C. while another loop contains liquid at high temperature (e.g., Galden or Fluorinert, etc. at a temperature setpoint of 55° C.). As such, referring back to FIG. 1, when p is negative, cooling is required and a valve 385 (FIG. 3A) is opened. Similarly when p is positive, then a valve 386 for the heating loop is opened. In preferred embodiments, only one of the heating and cooling valves 385 and 386 is open at any particular time such that a total fluid flow to the chuck 320 at any given time is delivered from either the chiller 377 or the HTX 378.

Figure 3B:
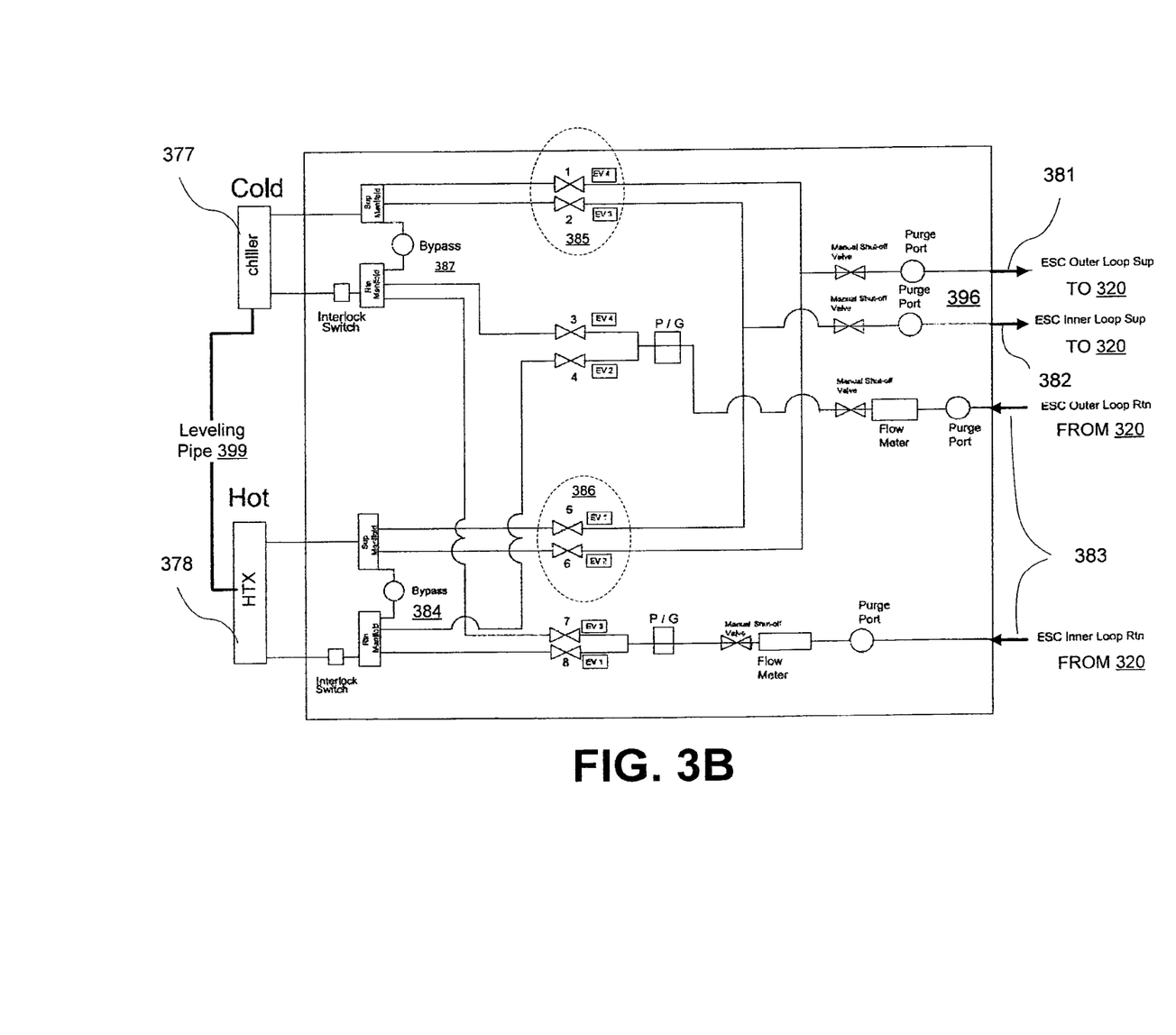
FIG. 3B illustrates a valve and plumbing schematic for the heat transfer fluid-based heat source/sink employed in the plasma etch system of FIG. 3A, in accordance with an embodiment of the present invention.

FIG. 3B illustrates a valve and plumbing schematic for the heat transfer fluid-based heat source/sink employed in the plasma etch system of FIG. 3A, in accordance with an embodiment of the present invention. As further depicted, a pair of heat transfer fluid supply lines 381 and 382 are coupled to the chiller 377 and a heat transfer fluid channel embedded in the chuck 320 (subjacent to a working surface of the chuck upon which workpiece 310 is disposed during processing) via the valves 385 (EV 4 and EV 3, respectively). The line 381 is coupled to a heat transfer fluid channel embedded subjacent to a first, outer zone, of the chuck working surface while the line 382 is coupled to a heat transfer fluid channel embedded subjacent to a second, inner zone, of the chuck working surface to facilitate dual zone cooling. Similarly, the line 381 and 382 also couples the chuck 320 to the HTX 378 via the valves 386 (EV2 and EV 1, respectively) to facilitate dual zone heating. Return lines 383 complete the coupling of each of the inner and outer zone heat transfer fluid channels to the chiller/HTX, 377/378 via return valves EV 3 and EV1.

Figure 3C:
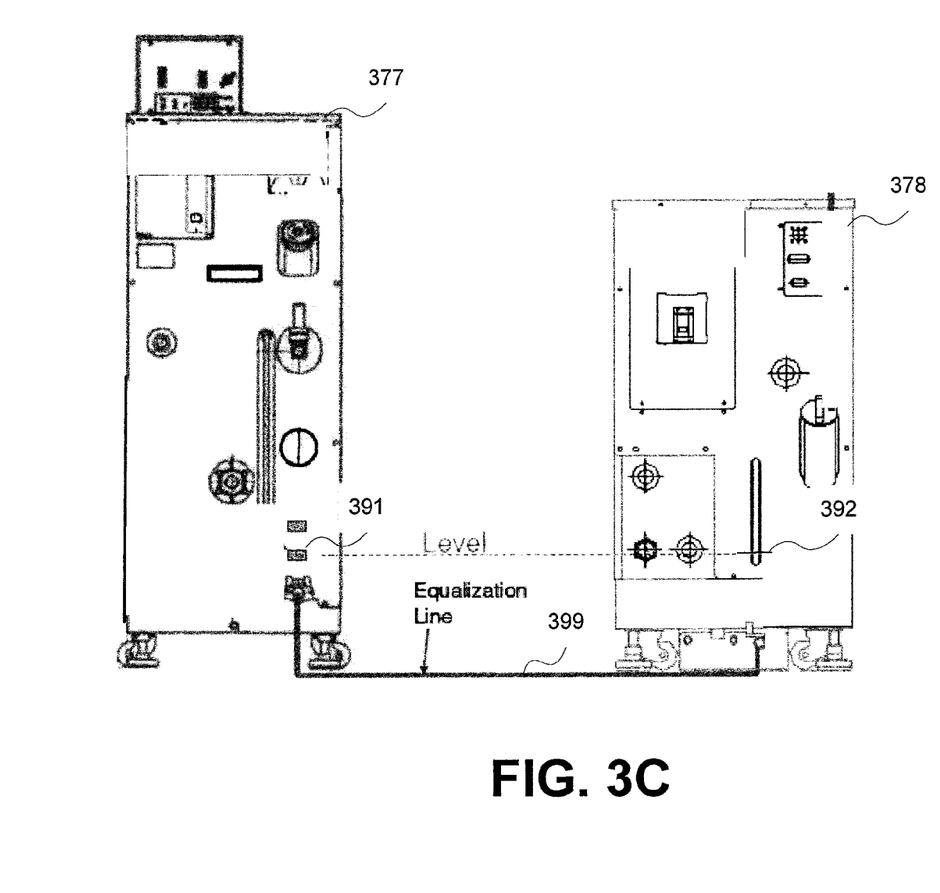
FIG. 3C illustrates a passive equalization line extending between a hot and a cold heat transfer fluid reservoir employed in the heat transfer fluid-based heat source/sink depicted in FIG. 3B, in accordance with an embodiment of the present invention.

Each of the chiller 377 and the HTX 378 includes a heat transfer fluid reservoir (i.e., tank or bath) which is to operate at a setpoint temperature to sink or source thermal energy. A passive leveling pipe 399 couples the first heat transfer fluid reservoir to the second heat transfer fluid reservoir to equalize heat transfer fluid levels by gravity. The passive leveling pipe 399 may be any conventional conduit, such as ¾" ID flexline. Gravity fed equalization is advantageous where the operation of the valves 385 and 386 (and similarly return valves EV1 and EV3) is such that over time heat transfer fluid levels in the chiller 377 would otherwise deviate from those in the HTX 378. This is particularly an issue where a pulsed heating/cooling is utilized such that only one of valves 385, 386 is open at any given time and each valve may be cycled frequently. Even where the return valve EV3 or EV 1 is switched in phase with the valve 385 or 386, respectively, it has been found that during operation small variations in valve actuation rates, etc. can result in a net migration of heat transfer fluid between the chiller 377 and HTX 378. FIG. 3C further illustrates the passive equalization pipe 399 extending between the hot and a cold heat transfer fluid reservoirs, in accordance with an embodiment of the present invention. As depicted, a low level mark 391 for the chiller reservoir is configured on a platform to be leveled with a low level mark 392 of the heat exchanger reservoir. With the chiller 377 and HTX 378 so arranged, the equalization pipe 399 may be fitted to drain ports of the hot and cold reservoirs.

During operation, because each of the hot and cold coolant loop is tapped to control the chuck temperature, the leveling pipe 399 operates to negate any difference in the amount of fluid which is returned from the chuck 320 to the cold and hot reservoirs of the chiller and heater 377, 378 respectively. Without any active valve control along the equalization pipe 399, a small flux of heated and/or chilled heat transfer fluid will occur in response to small deviations between the cold and hot supply and return apportioning to keep the reservoirs filled to equal levels. Because of the relatively small fluid transfer incurred by operation of the temperature control valves, the leveling pipe 399 places little additional load on the HX and/or Chiller, 377, 378.

In the exemplary embodiment depicted in FIG. 3B, the temperature controller 375 is coupled to a pulse width modulation (PWM) controller 380. For embodiments where the valves 385 and 386 are digital and further operating such that only one is open at any given time, heating and cooling of the chuck 320 is referred to as "pulsed." A pulse of cooling power is provided when valve 385 is controlled to the open state for a period of time defined by a duty cycle, as further described elsewhere herein. Similarly, a pulse of heating power is provided to the chuck 320 when valve 386 is controlled to be in the open state for a period of time defined by the duty cycle. The PWM controller 380 may be of any type commonly available and configurable to operate the valves 385 and 386 for embodiments where those valves are digital (i.e., having binary states; either fully open or fully closed) at a duty cycle dependent on control signals sent by the temperature controller 375. In alternative embodiments, a PID controller which supports PWM functionality and provides for external control of duty cycles, such as, but not limited to one of those commercially available from Azbil of Yamatake Corp., Japan, may be employed to implement feedforward control algorithms described herein. In still other alternatives, a PWM control signal may be produced by a digital output port of a computer (e.g., controller 370) and that signal can be used to drive a relay that controls the valves 385, 386 to on/off positions. For embodiments where the temperature controller 375 implements the temperature control system 100, the PWM controller 380 is utilized exclusively as a driver of the digital valves 385 and 386.

With the valves 385 and 386 periodically closing, to maintain a reasonably low pressure for the pump associated with the isolated heat source/since, a bypass is provided between the heat transfer fluid reservoirs (i.e. chiller 377 or heater 378) and the valves 385, 386. Heat transfer fluid is returned to the chiller 377 via the bypass 384 when the valve 385 is closed while heat transfer fluid is returned to the HTX 378 via the bypass 387 when the valve 386 is closed. A very large bypass will cause inefficient operation with heating/cooling power wasted while a very small bypass places too high of a load on the pump. It has been found that the supply line flow to chuck 320 (e.g., either of 381 and 382) should be split with the bypass such that the flow through the chuck 320 is greater than through the bypass (387 or 384). In particular embodiments providing good performance, the ratio between flow to the chuck 320 (via either valve 385 or 386) is between 1:0.8 and 1:0.2. For example, where the flow in the supply line 381 is approximately 2.5 GPM and the flow in supply line 382 is also 2.5 GPM, the flow through bypass 384 is approximately 1 GPM.

Figure 3D:
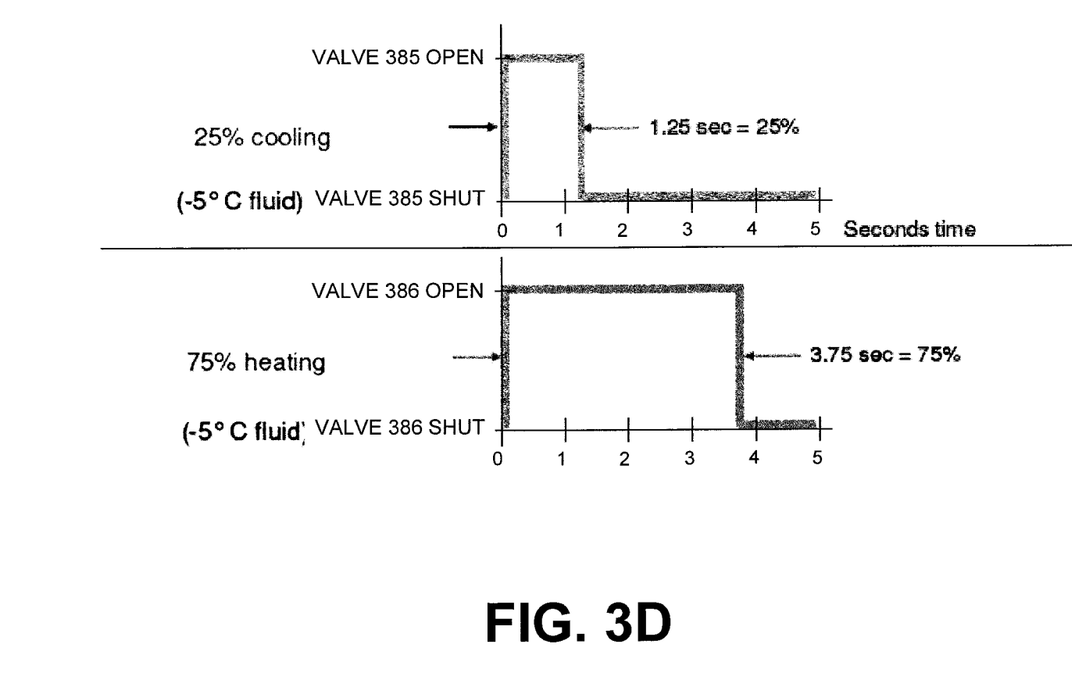
Figure 3E:
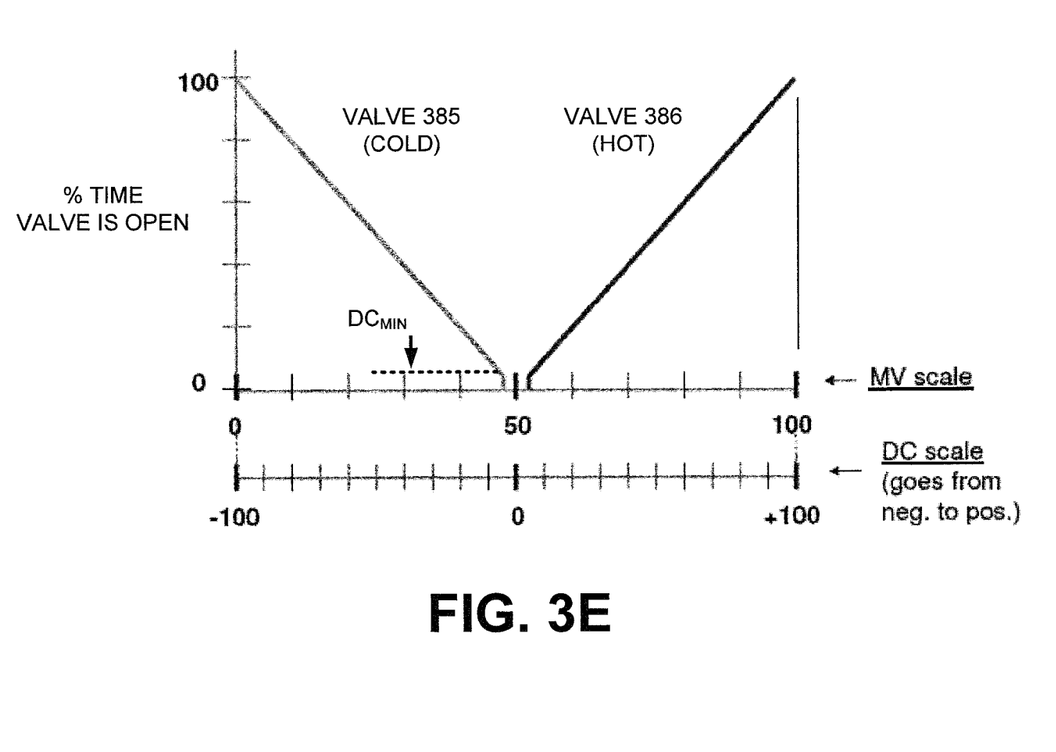
FIG. 3E illustrates time proportioning in pulse width modulation employed to control the valves 385, 386 of the plumbing schematic depicted in FIG. 3B, in accordance with an embodiment of the present invention

FIGS. 3D and 3E illustrate time proportioning in pulse width modulation in the valve and plumbing schematic depicted in FIG. 3B, in accordance with an embodiment of the present invention. As illustrated in FIG. 3D, a base unit of time, the "proportioning cycle time" is utilized for proportioning of a duty cycle to allow digital values 385, 386 to approximate analog heating/cooling power application by cycling heat transfer fluid flow to the chuck 320 between a fixed nominal open valve fluid flow rate (e.g., 2.5 GPM) and a closed valve fluid flow of zero. As shown in FIG. 3D, the percent of a time a digital valve is open of the proportioning cycle is referred to as the duty cycle (DC). For 25% DC cooling, the valve 385 is in the open state for 25% of the proportioning cycle time (e.g., 1.25 seconds). Similarly, for 75% DC heating the valve 386 is in the open state for 75% of the proportioning cycle time (e.g., 3.75 seconds).

The duration of the proportioning cycle time is important to achieve the fast temperature response time and good steady state control illustrated in FIG. 2. The proportioning cycle is to have a duration that is shorter than the thermal time constant of the chuck 320 (which is dependent at least in part, on the thickness of the puck as discussed elsewhere herein). The thermal time constant of the chuck 320 serves to smooth out temperature ripples which may be incurred by the pulsed application of the heating/cooling power. Thus, while a very short thermal time constant reduces the response time by the control system 100, a very short thermal time constant will allow working surface temperature ripples to appear as a result of the pulsed heating/cooling power application. The magnitude of such ripples may be as great as a few degrees which may, depending on the process sensitivity, be disadvantageous during workpiece processing. Therefore, it is important to define a proportioning cycle time which is well-matched to the thermal time constant of the chuck 320. In a particular embodiment, the proportioning cycle duration is no greater than one half of the thermal time constant of the chuck 320, and preferably substantially less than half.

The minimum proportioning cycle duration is generally limited by the rate at which a digital valve (e.g., valves 385, 386) can switch states. As illustrated in FIG. 3E, the duty cycle scale extends from a DC minimum value to 100 (positive) for control of the valve 386 while the duty cycle scale extends the DC minimum value to −100 (negative) for control of the valve 385. As such, depending on the DC value, only one of the valves 385 and 386 are open at any given time with both in an "off" or closed state for any DC % falling below the minimum DC. Any PWM driving pulses that are shorter than the minimum DC % is truncated by the controller 375 to exactly zero. The proportioning cycle duration should be chosen to be sufficiently large that switching time of the valves is not a substantial percentage of the proportioning cycle. In one embodiment, the time proportioning cycle is more than one order of magnitude longer than the time required to change the state of the valve. In a preferred embodiment where the rate at which the valves 385 and 386 switch is less than 0.35 seconds, the proportioning cycle duration is between 4 and 6 seconds (e.g., 5 seconds as depicted in FIG. 3D). With a 5 second proportioning cycle duration, a valve switching time will account for less than 10% of the duty cycle range and for embodiments where the valve switching time is between 0.25 and 0.35 seconds, the valve switching time accounts for approximately 5-6% DC on each of the hot and cold controls. Thus, a temperature of the chuck 320 will be allowed to drift an amount before valve 386 is called upon at minimum DC of 6%, for example. Very small duty cycles will typically occur only during idle periods, so this level of steady state temperature control is adequate.

A further consideration impacting proportioning cycle duration is the internal volume of the supply lines 381 and 382 which represent dead volumes of heat transfer liquid that are not held at the heat sink/source temperature. Preferably, the coolant volume in the region of the plumbing between the valve 385, 386 (or at least between the container 396) and the chuck 320 is not large relative to the volume of coolant flowed during a pulse duration. In an exemplary embodiment, the supply line 381 and/or 382 has an internal volume which is less than the volume of heat transfer fluid conducted during a time proportioning cycle (e.g., 100% DC). As the supply line volume is a function of both length and diameter, reduced volumes can be achieved with smaller diameter lines and/or shorter lengths which would permit the proportion cycle duration to be reduced to the limit of the thermal time constant of the chuck 320. However, ¼" ID connecting lines disadvantageously require a pump to provide a very high pressure to generate sufficient coolant flow rate, which for example is to be between 1 gallon/minute (GPM) and 7 GPM. The preferred open valve flow rate is 2-6 GPM to provide adequate cooling power under the high thermal loads present in dielectric etch system (e.g., $W_{b,tot}$~7000K). To provide sufficiently low flow resistance, at least ¾ "ID piping is utilized in preferred embodiments where the length of the lines 381 and/or 382 is approximately 8 feet or less. Given longer lines are often easier to facilitize, lines 381 and/or 382 may be extended to 15 feet if piping ID is reduced to ½". For such embodiments, the dead volume can be kept to below one liter while nearly one liter of the heat transfer fluid is conducted during the exemplary 5 second proportioning cycle duration.

In embodiments, the chuck 320 and showerhead 335 has a fixed gap spacing of 1.25 inch. The chuck 320 may further incorporate either a thin ceramic puck 427 or a thick ceramic puck 428, as further illustrated in FIGS. 3F and 3G. As used herein, "a puck" refers to a slab of ceramic which separates the workpiece 310 from the temperature controlled base 329. The puck sinks heat flux resulting from ion bombardment, capacitively couples RF power to the workpiece 310, and also encapsulates an electrode providing a clamping force to hold the workpiece 310 to the chuck 320.

Figure 3F:
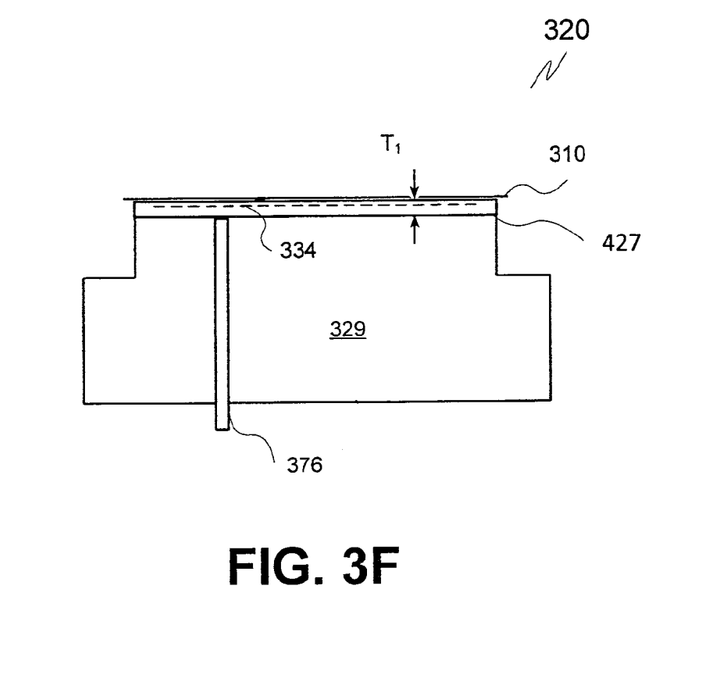
FIG. 3F illustrates a chuck assembly including a thin puck employed in the etch system depicted in FIG. 3A, in accordance with an embodiment of the present invention.
Figure 3G:
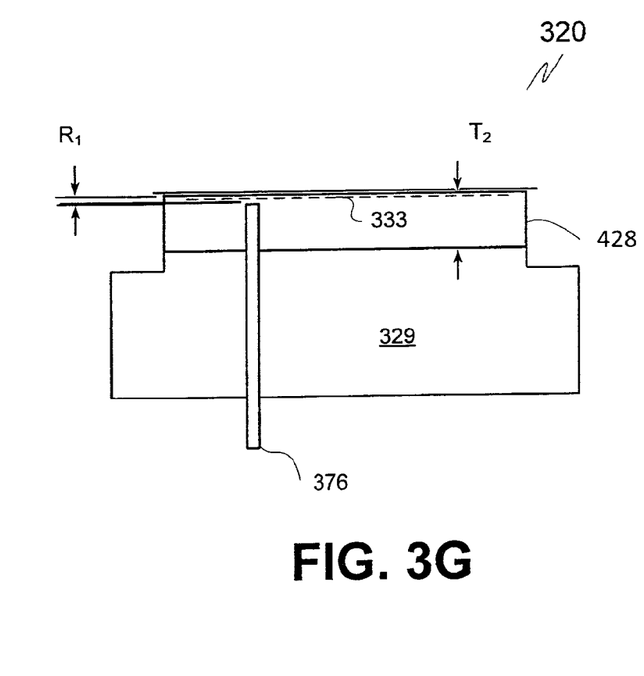
FIG. 3G illustrates a chuck assembly including a thick puck employed in the etch system depicted in FIG. 3A, in accordance with an embodiment of the present invention.

For the thick puck embodiment depicted in FIG. 3G, electrostatic chucking (ESC) is provided with an RF powered and DC biased electrode 333 embedded within the puck while the base 329 is grounded. For thin puck embodiments, electrostatic chucking is provided with a DC biased, but RF floating electrode 334 embedded within the puck while the base 329 is RF powered. For thin puck embodiments, a grounded ESC base is disadvantageous because of large shunt capacitance. This issue is not typical for thick puck embodiments as the ESC electrode and workpiece may be disposed a greater distance from the ground plane of the base 329.

The thickness of the ceramic puck has an effect on the thermal time constant of the chuck 320 and therefore an impact on the magnitude of the delay D1 illustrated in FIG. 2. In one thin puck embodiment (FIG. 3F) the nominal thickness T1 of the ceramic puck 427 is less than 10 mm and more specifically approximately 5 mm. In one thick puck embodiment, the nominal thickness T2 of the ceramic puck 328 is greater than 10 mm and more specifically approximately 25 mm. For example, the thermal time constant of the chuck 320 may vary between about 5 second and 60 seconds depending on the thickness of the ceramic. In a particular embodiment, chuck with a thin puck 427 having a nominal 5 mm ceramic thickness has a time constant of about 10 seconds while a chuck with a thick puck 428 having a nominal 25 mm ceramic thickness has a time constant on the order of 60 seconds. The low thermal time constant of the thin puck embodiments enable the fast temperature ramping in successive steps of a (etch) process recipe of the type illustrated in FIG. 2. Thick puck embodiments, because of the larger thermal mass, can be expected to have a significantly longer response time (e.g., D1 in FIG. 2 may be over 60 seconds). For embodiments with a proportioning cycle duration of approximately 5 seconds, the 10 second thermal time constant of a thin ceramic puck reduces temperature ripple to about 1° C. or less. Thus, the 5 second proportioning cycle duration is well-matched to thin puck embodiments with cycle durations that are significantly longer becoming too close to the thermal time constant of the chuck 320. Because the thermal time constant of the thick puck embodiments is so much longer, the proportion cycle duration might be increased beyond 5 seconds without incurring noticeable temperature ripple in the working surface temperature. Nonetheless, in preferred thick puck embodiments, a 5 second proportion cycle is utilized so that the algorithms executed by the control system 100 are made less dependent upon where a thick or thin ceramic puck is present.

As further illustrated in FIGS. 3F and 3G, one or more temperature probes 376 are embedded in the lower support assembly depending on the number of independent temperature zones. Non-metallic probes are preferred to avoid RF coupling/filtering issues and in one embodiment a fluoro-optic fiber temperature probe is employed. In multi-zone embodiments (e.g., dual zone), two or more such probes are embedded in the lower support assembly. For example a first probe 376 may be disposed subjacent to an inner zone of the chuck while a second probe 376 may be disposed subjacent to an outer zone of the chuck. The temperature probe 376 is disposed within the lower assembly dependent on whether a thin or thick puck is employed. In one thin puck embodiment, as illustrated in FIG. 3F, the temperature probe tip is disposed in contact with a backside of the thin ceramic layer. As such, the probe tip is not embedded within the thin ceramic layer and the tip of probe 376 is separated by approximately 5 mm from the working surface upon which the workpiece 310 is disposed. In the thick puck embodiment illustrated in FIG. 3G, the tip of the temperature probe 376 is embedded or recessed within the thick ceramic layer so that R1 is less than 5 mm from the working surface upon which the workpiece 310 is disposed. In a particular embodiment, the R1 is approximately 3 mm from the working surface. Disposing the probe tip within the lower assembly in a manner dependent on whether a thin or thick puck is employed allows much of the temperature control system 100 hardware and measurement calibration to be retained between systems having different ceramic puck thicknesses. Ceramic pucks may therefore be swapped out to reconfigure a particular system based on the processing to be performed, etc.

Returning to FIG. 3A, the temperature controller 375 is to execute the temperature control algorithms and may be either software or hardware or a combination of both. The temperature controller 375 is to output control signals affecting the rate of heat transfer between the chuck 320 and a heat source and/or heat sink external to the plasma chamber 305. In one feedforward embodiment, with the passage of a sample time, Tcalc, the current controlled temperature 150 (FIG. 1) is acquired, the temperature setpoint 106 is acquired, and the plasma power 105 is acquired. A temperature setpoint for the heat sink(s) may also be acquired. In the exemplary embodiment depicted in FIG. 3, the temperature controller 375 receives a controlled temperature input signal from the chuck temperature sensor 376 (e.g., optical probe). The temperature controller 375 acquires a chuck setpoint temperature from a process recipe file, for example stored in the memory 373, and the temperature controller 375 acquires a plasma power (measured or as set by a recipe file parameter).

The temperature controller 375 need not be contained within, or provided by, the integrated control software plane 125 (see FIG. 1). Specifically, the functionality of temperature controller 375 may instead be provided as discrete system. For example, PID controllers, such as, but not limited to those commercially available from Azbil of Yamatake Corp., might in the future, be designed to include additional feedforward inputs, such as the plasma power and chiller temperature. The discrete system may further be manufactured to include a processor having the ability to determine a feedforward control effort based on those feedforward inputs. As such, all the embodiments described herein for temperature control may be provided either by the temperature controller 375 as a facet of integrated control software plane 125 or as a facet of the PWM controller 380.

In a preferred embodiment, a measured forward RF bias power 328 energizing a plasma in the process chamber 305 at the current time (e.g., after passage of $T_{calc}$) is input into the feedforward control line as a plasma heat load (e.g., Watts). Plasma power setpoint values (e.g., from a process recipe file stored in a memory 373) may also be utilized as an input to the feedforward control line. Such power setpoint values, being predefined, may enable the feedforward transfer function F(s) 115 to be evaluated for the power setpoint prior to application of plasma power or prior to a change in the application of plasma power into the system and generate an anticipatory control effort. However, assuming the temperature control system 100 can react sufficiently quickly, the plasma power 105 is preferably coupled to a measured power output signal for greater accuracy of the plasma power applied at current time. Even for such embodiments, control effort determinations for future time would remain recipe-based.

In an embodiment, the plasma power 105 comprises a first bias power input to a chuck configured to support a workpiece during plasma processing. For example, the plasma power 105 may be set to the plasma bias power 325 (FIG. 3). In an embodiment, the plasma power 105 is a weighted sum of multiple power inputs to the plasma processing chamber. For example, a weighted sum of Plasma Power equals c1*P1+c2*P2+c3*P3, where P1, P2 and P3 are the bias and/or source powers. The weights c1, c2, and c3 may be any real number, and are typically positive although in certain embodiments, a weight of a source power is negative where component heating is actually reduced with an increase in source power. For example where the plasma processing system applies a 2 MHz and 13.56 MHz bias power input to a chuck or a 2 MGz and 60 MHz bias power input to a chuck, c1 and c2 are each 1. With the first and/or second plasma bias powers input as the plasma power 105, the feedforward transfer function F(s) 115 relates the bias power input (e.g., measured as forward bias power 328 output from RF match 327) to the feedforward control signal u defining a cooling effort to compensate the disturbance transfer function D(s) 110.

While in the exemplary embodiment the weighted sum of the bias powers ($W_{b,tot}$) is input as the plasma power 105, it should be noted that one or more of the total plasma power input into the process chamber may be excluded from the plasma power 105 as a function of weighting. For example, referring to FIG. 3, the plasma source power 330 is excluded from the plasma power 105 (i.e., c3=0) where the control system 100 (FIG. 1) is to control the temperature of the electrostatic chuck 320. For such an embodiment, the plasma power 105 need not include the plasma source power 330 because the heat load placed on the chuck 320 by the plasma source power 330 is relatively small. In alternative embodiments however, where the temperature to be controlled has an appreciable dependence on all plasma power input into a processing chamber, the feedforward control signal u output from the feedforward transfer function F(s) 115 may be further based on the plasma source power 330.

A temperature error signal e, the feedforward control signal u, and the feedback control signal v are computed at every $T_{calc}$ (e.g., by the CPU 372). In the Laplace domain $$u(s)=F(s)p(s),$$

where u is the feedforward signal, F is the Feedforward transfer function and p is the plasma power. For the embodiment depicted in FIG. 3, the feedforward control signal u may be implemented in discrete time domain as:

$$u(t)=\beta_o P(t)+\beta_1 P(t-T_{PWM})+\beta_2 P(t-2T_{PWM})+\ldots\alpha_1 u(t-T_{PWM})+\alpha_2 u(t-2T_{PWM})+\alpha_3 u(t-3T_{PWM})+\ldots$$

where P(t) is the plasma power 105 at the current $T_{calc}$, and where $T_{PWM}$ is a time increment of the PWM controller 380. In a particular embodiment, feedforward control signal u is computed as simply $\beta_o P(t)$ to be based on the plasma power input at the current time (e.g., $T_{calc}$).

In a further embodiment, because the plasma power to be requested in future time periods is determinable (e.g., from the process recipe file), the feedforward expression further includes the terms $\theta_1 P(t+T_{PWM})+\theta_2 P(t+2T_{PWM})$ to compensate for lag in the effect of the coolant flow on the controlled temperature. In another embodiment, the heat transfer required to achieve the controlled temperature 150 is dependent on the heat sink (e.g., chiller 377) temperature setpoint and/or heat source (e.g., heat exchanger 378) temperature setpoint such that the additional coolant temperature dependent term $\delta_c(T_{SP}-T_{heat\,sink})+\delta_c(T_{SP}-T_{heat\,source})$ added to the feedforward control signal u, where $T_{SP}$ is the controlled temperature 150. The entire feedforward equation can also have factors for temperature dependence, $\Omega_{hot}$ and $\Omega_{cold}$, such that the net feeedfoward control signal u becomes:

$$u(t)=\Omega_{hot}(T_{SP}-T_{heat\,source})\Omega_{cold}(T_{SP}-T_{heat\,sink})\{\beta_o P(t)+\beta_1 P(t-T_{PWM})+\beta_2 P(t-2T_{PWM})+\ldots\alpha_1 u(t-T_{PWM})+\alpha_2 u(t-2T_{PWM})+\alpha_3 u(t-3T_{PWM})+\ldots\theta_1 P(t+T_{PWM})+\theta_2 P(t+2T_{PWM})+\delta_c(T_{SP}-T_{heat\,sink})+\delta_c(T_{SP}-T_{heat\,source})\}.$$

Similarly, the feedback control signal v is v(t)=G(s)&(s) in the Laplace domain and may be implemented in discrete time domain as:

$$v(t)=\lambda_o e(t)+\lambda_1 e(t-T_{PWM})+\lambda_2 P(t-2T_{PWM})+\ldots\eta_1 v(t-T_{PWM})+\eta_2 v(t-2T_{PWM})+\eta_3 v(t-3T_{PWM})+\ldots$$

Where e(t) is the temperature error signal (difference between controlled temperature 150 and temperature setpoint 106) at $T_{calc}$. In a particular embodiment, feedback control signal v is computed as simply $\lambda_o e(t)$. While the operation is performed every $T_{calc}$, the control computations are to use input temperatures and plasma power values input at some lower frequency corresponding to times t, $t-T_{PWM}$, etc,. Values for the parameters of u, v, plasma power 105 (P), controlled temperature 150, and temperature setpoint 106 may be stored in a data array and those stored values corresponding to the discrete times of t, $t-T_{PWM}$ may then be utilized in subsequent control calculations.

A control actuator output signal p is determined from the combination of the feedforward signal u and feedback signal v and then output to the actuator. In one embodiment, a constant gain $K_v$ is applied to the feedfoward control signal u and a constant gain $K_u$ is applied to the feedforward control signal v such that the control actuator output signal ρ is calculated as $\rho(t)=K_v v-K_u u$. The gains $K_v$, $K_u$ provide a system operator a simple interface to access the combined feedforward and feedback control line in two simple factors. Depending on the value of the control actuator output signal p, heat transfer between one or more of a heat sink and heat source is modulated. In FIG. 3 therefore, where the control actuator output signal p is of a first sign (e.g., ρ<0), a command may then be provided in a form executable by the PWM controller 380 to drive the valve 385 open to increase the heat transfer between the chiller 377 and the chuck 320 to reduce the controlled temperature 150. Where the control actuator output signal p is of a second sign (e.g., ρ>0), a command may then be provided by the PWM controller 380 to drive the valve 386 open to reduce the heat transfer between the chiller 377 and the chuck 320 to increase the controlled temperature 150.

Figure 4:
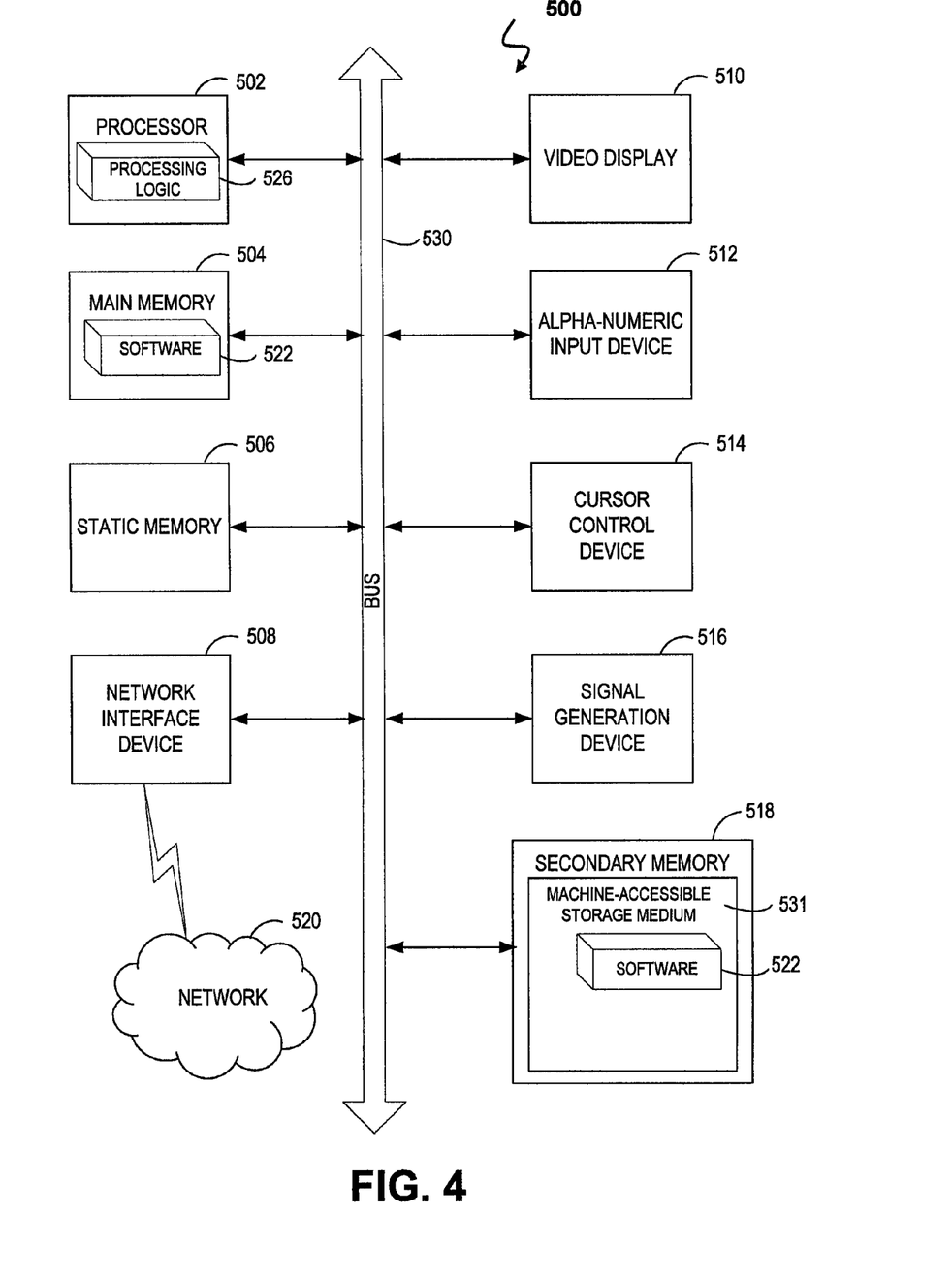
FIG. 4 illustrates a block diagram of an exemplary computer system incorporated into the plasma etch system depicted in FIG. 3, in accordance with one embodiment of the present invention.

FIG. 4 illustrates a diagrammatic representation of a machine in the exemplary form of a computer system 500 which may be utilized to perform the temperature control operations described herein. In one embodiment, the computer system 500 may be provisioned as the controller 370 in the plasma etch system 300. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the temperature control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the temperature control algorithms described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the temperature control algorithms described herein. Embodiments of the present invention may further be provided as a computer program product, or software, that may include a machine-readable medium having stored thereon instructions, which may be used to program a computer system (or other electronic devices) to control a plasma processing chamber temperature according to the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other non-transitory storage media.

It is to be understood that the above description is intended to be illustrative, and not restrictive. Many other embodiments will be apparent to those of skill in the art upon reading and understanding the above description.

What is claimed is:

1. A method of controlling a temperature of a chuck in a plasma processing apparatus, the method comprising:
   providing a first heat transfer fluid at a first temperature to the chuck via a first supply line and a first return line coupling the chuck to a first heat transfer fluid reservoir;
   providing a second heat transfer fluid at a second temperature to the chuck via a second supply line and a second return line coupling the chuck to a second heat transfer fluid reservoir;
   controlling a first valve coupling the first heat transfer fluid reservoir with the first supply line and controlling a second valve coupling the second heat transfer fluid reservoir with the second supply line; and
   equalizing a level of the first heat transfer fluid reservoir with a level of the second heat transfer fluid reservoir by flowing either the first or second heat transfer fluid through a passive leveling pipe coupling the first heat transfer fluid reservoir to the second heat transfer fluid reservoir.

2. The method of claim 1, further comprising:
   modulating a pulse width modulation duty cycle driving at least one of the first and second valves between a fully open state and a fully closed state, such that one of the first and second valves is to be in the off state when the other of the first and second valves is in the on state.

3. The method of claim 2, wherein the pulse width modulation duty cycle is modulated based at least on a total power applied to a plasma, the total power being a weighted sum of at least a first bias power from an RF generator operating between approximately 2 MHz and 60 MHz and a second bias power from an RF generator operating between approximately 2 MHZ and 60 MHz.

4. The method of claim 1, further comprising splitting a fluid flow bypass returning heat transfer fluid to the first heat transfer fluid reservoir with the first valve a first valve:bypass ratio between 1:0.8 and 1:0.2.

5. The method of claim 1, wherein the duration the first valve is opened is dependent on the pulse width modulation duty cycle as a percentage of a time proportioning cycle, the time proportioning cycle being more than one order of magnitude longer than the time required to change the state of the first valve.

6. The method of claim 5, wherein the time proportioning cycle duration is less than half the thermal time constant of the chuck.

7. The apparatus as in claim 6, wherein the time proportioning cycle duration is between 4 and 6 seconds.

* * * * *